(12) United States Patent
Martines et al.

(10) Patent No.: US 7,085,163 B2
(45) Date of Patent: Aug. 1, 2006

(54) GATE VOLTAGE REGULATION SYSTEM FOR A NON-VOLATILE MEMORY CELLS PROGRAMMING AND/OR SOFT PROGRAMMING PHASE

(75) Inventors: Ignazio Martines, Aci Castello (IT); Davide Torrisi, Acireale (IT)

(73) Assignee: STMicroelectronics S.r.l. (IT)

( * ) Notice: Subject to any disclaimer, the term of this patent is extended or adjusted under 35 U.S.C. 154(b) by 223 days.

(21) Appl. No.: 10/788,525

(22) Filed: Feb. 26, 2004

(65) Prior Publication Data
US 2004/0233722 A1 Nov. 25, 2004

(30) Foreign Application Priority Data
Feb. 28, 2003 (EP) .................................. 03425134

(51) Int. Cl.
  *G11C 11/34* (2006.01)
  *G11C 16/06* (2006.01)
(52) U.S. Cl. ........................... 365/185.18; 365/185.03; 365/185.21; 365/189.09
(58) Field of Classification Search ........... 365/185.18, 365/185.33, 185.21, 185.29, 185.3, 189.09, 365/185.03
See application file for complete search history.

(56) References Cited

U.S. PATENT DOCUMENTS

| 5,515,327 | A |   | 5/1996  | Matsukawa et al. |            |
|-----------|---|---|---------|------------------|------------|
| 5,687,116 | A | * | 11/1997 | Kowshik et al.   | 365/185.03 |
| 5,777,926 | A | * | 7/1998  | Trinh et al.     | 365/185.19 |
| 5,822,247 | A | * | 10/1998 | Tassan Caser et al. | 365/185.18 |
| 6,392,936 | B1 |   | 5/2002 | Mulatti et al.   |            |
| 6,493,266 | B1 | * | 12/2002 | Yachareni et al. | 365/185.22 |

FOREIGN PATENT DOCUMENTS

EP          0 432 050          6/1991

OTHER PUBLICATIONS

European Search Report, EP 03 42 5134, dated Jul. 28, 2003.

\* cited by examiner

*Primary Examiner*—Richard Elms
*Assistant Examiner*—Toan Le
(74) *Attorney, Agent, or Firm*—Jenkens & Gilchrist, P.C.

(57) ABSTRACT

A plurality of non volatile memory cells, for example of the flash type, with low circuit area occupation, are organized in cell matrices with corresponding circuits responsible for addressing, decoding, reading, writing and erasing the memory cell content. Each of the cells has a gate terminal biased in the programming phase with a predetermined voltage value through operation of charge pump voltage regulators. A first and a second regulation stage, which are structurally independent, are responsible for the programming and soft programming phase respectively. The first stage generates a supply voltage for the second stage.

20 Claims, 5 Drawing Sheets

GATE VOLTAGE REGULATION SYSTEM FOR A NON-VOLATILE MEMORY CELLS PROGRAMMING AND/OR SOFT PROGRAMMING PHASE

PRIORITY CLAIM

The present application claims priority from European Patent Application No. 03425134.8 filed Feb. 28 2003, the disclosure of which is hereby incorporated by reference.

BACKGROUND OF THE INVENTION

1. Technical Field of the Invention

The present invention relates to a gate voltage regulation system for the programming and/or soft programming phase of non volatile memory cells. More particularly, the invention relates to a gate voltage regulation system for the programming and/or soft programming phase of non volatile memory cells, for example of the flash type, with low circuit area occupation.

2. Description of Related Art

As it is well known in this specific technical field, in modern semiconductor-integrated non volatile memory devices, for example in flash EEPROM memories, the need to apply very "precise" voltages to memory cells in the writing step is increasingly felt. This is generally valid both for writing cells having a grounded bulk terminal, essentially with Vbulk=0, and for negative Vbulk writing.

Writing operations for a Flash memory are essentially of two types:
real programming, in order to change the logic status of a cell from erased to programmed; and
soft programming, which is a low efficiency kind of programming required to control more precisely the threshold shift of a given cell.

Usually, a soft programming is necessary after an erasing in order to recover all those bits whose threshold near to zero could cause false reading problems in a NOR memory architecture.

The circuits involved in both the programming and the soft programming operation are essentially the same, differing only in that the voltages required in the soft programming phase are lower than the voltages of the programming phase. More particularly, the following rules quoted in Table 1 are generally valid:

TABLE 1

| | | Programming | Soft Programming |
|---|---|---|---|
| $V_{gate}$ | Ramp | Vstart-p, Vfinal-p, ΔTpulse-p | Vstart-p, Vfinal-p, ΔTpulse-p |
| $V_{drain}$ | Const. | $V_d$ | $V_d$ |
| $V_{bulk}$ | Const. | 0 or negative | 0 or negative |
| $V_{source}$ | Const. | 0 | 0 |

Essentially, the programming phase is performed by applying a ramp voltage on the memory cell gate terminal, thus ensuring (if performed with a quite precise ramp slope) the desired threshold shift in the desired time and with a constant current. By indicating the voltage values at the ramp beginning and end with the references Vstart and Vfinal and the ramp duration with Tprogram, a constant current programming is obtained, as shown in FIG. 1.

The ramp can be generally formed in two ways:
analogue; which is obtained by means of a linear ramp; and
through pulses; which is obtained by means of several short pulses in order to interpolate the linear feature.

The problems linked to the creation of a pulse ramp will now be considered. Such a voltage ramp must be linear with values Vstart, Vfinal, Tpulse=Tprogram being as independent as possible from operating conditions, such as for example:

Vsupply, memory device supply voltage;
operating temperature; and
capacitive load change It is not simple at all to manufacture a circuitry which succeeds, with low area occupation, in ensuring a constant ramp when the above-mentioned operating conditions vary. Moreover, once the regulation system to be used is defined and fixed, it does not mean that it equally suits both the programming and the soft programming phase.

The potential limits of a single regulation system will be examined first. The problems linked to the use of a single regulation system for both phases will be briefly analyzed.

Programming: in this case the voltage ramp, starting from low values being almost equal to the supply voltage for 3V-operating memories is brought to values near to technology-supportable values, for example ~10V. In this case it is necessary to form a ramp as near as possible to the ideal ramp, but without having a series regulator, since the voltage difference ΔV required at the regulator series transistor terminals would lead to an upstream voltage being dangerously near, if not even higher than the borderline voltage provided by the technology.

Referring to what has been described above, FIG. 2A, showing a threshold voltage distribution of memory array cells, can be observed. The programmed cell distribution is indicated with D2. The cell distribution after erasing is indicated with D1. Cells to be recovered after the erasing operation are in grey.

Similarly, FIG. 2B shows a threshold voltage distribution of the cells of a memory array wherein cells being over-recovered after the erasing operation are represented in percentage in grey, in the case of a high efficiency charge pump.

Generally, it is preferable to connect the charge pump output, responsible for the voltage ramp creation, directly to the gate node, by using an ON/OFF regulation. In this case problems are those linked to the pump efficiency. In fact, as shown in FIG. 3, in the ramp lower part, at low voltages, a high pump efficiency occurs, but this could lead to serious regulation problems intended as a ripple which cannot be easily controlled, and thus to a distorted ramp trend very far from being ideal. If the pump efficiency is to be decreased, serious problems could arise in the ramp upper part, where the pump would have difficulty to follow the ideal ramp, as shown in FIG. 4.

Soft Programming: in this case the problem is even more serious. In fact the charge pump operates at even lower voltage values, generally lower than supply voltages for a 3V-powered memory device. Therefore, the ripple management becomes in this case very demanding.

The technical problem underlying the present invention is to provide a gate voltage regulation system, particularly for the programming and soft programming phase of non volatile memory cells, having such structural and functional characteristics as to improve the voltage regulator answer fidelity at low voltages, overcoming the limits of present prior art solutions.

SUMMARY OF THE INVENTION

The present invention solves the foregoing and other problems by providing gate voltage regulation circuits that are structurally and functionally independent, with one responsible for the programming phase and another responsible for the soft programming phase.

In accordance with one embodiment of the invention, a gate voltage regulation system performs programming and/or soft programming of non volatile memory cells. The memory cells are organized in cell matrices with corresponding circuits responsible for addressing, decoding, reading, writing and erasing the memory cell content. The system includes charge pump voltage regulators for biasing gate terminals of the cells in the programming phase with a predetermined voltage value. A first regulation stage and a second regulation stage, which are structurally independent, are responsible for the programming phase and soft programming phase, respectively. The first stage generates a supply voltage for the second stage.

In accordance with another embodiment of the invention, a circuit includes a first and second voltage regulation stage. The first voltage regulation stage generates a voltage ramp output at a first output. The second voltage regulation stage generates a regulated voltage output at a second output. A selection switch responds to a control signal to selectively connect the first output to the second output.

In accordance with another embodiment of the invention, a circuit includes a plurality of volatile memory cells, each including a transistor, and each of the transistors sharing a common gate connection. A gate voltage regulator circuit includes an output coupled to the common gate connection and receives a programming control signal. The gate voltage regulator circuit comprises and first and second regulator. The first regulator generates a programming ramp voltage and the second regulator generates a soft programming voltage. A selection circuit responds to the programming control signal and applies the programming ramp voltage to the common gate connection in a first operating mode and applies only the soft programming voltage to the common gate connection in a second operating mode.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

With reference to the figures, a gate voltage regulation system for the programming and/or soft programming phase of non volatile memory cells, for example of the flash type, with low circuit area occupation, is globally and schematically indicated with reference 1.

Figure 6:
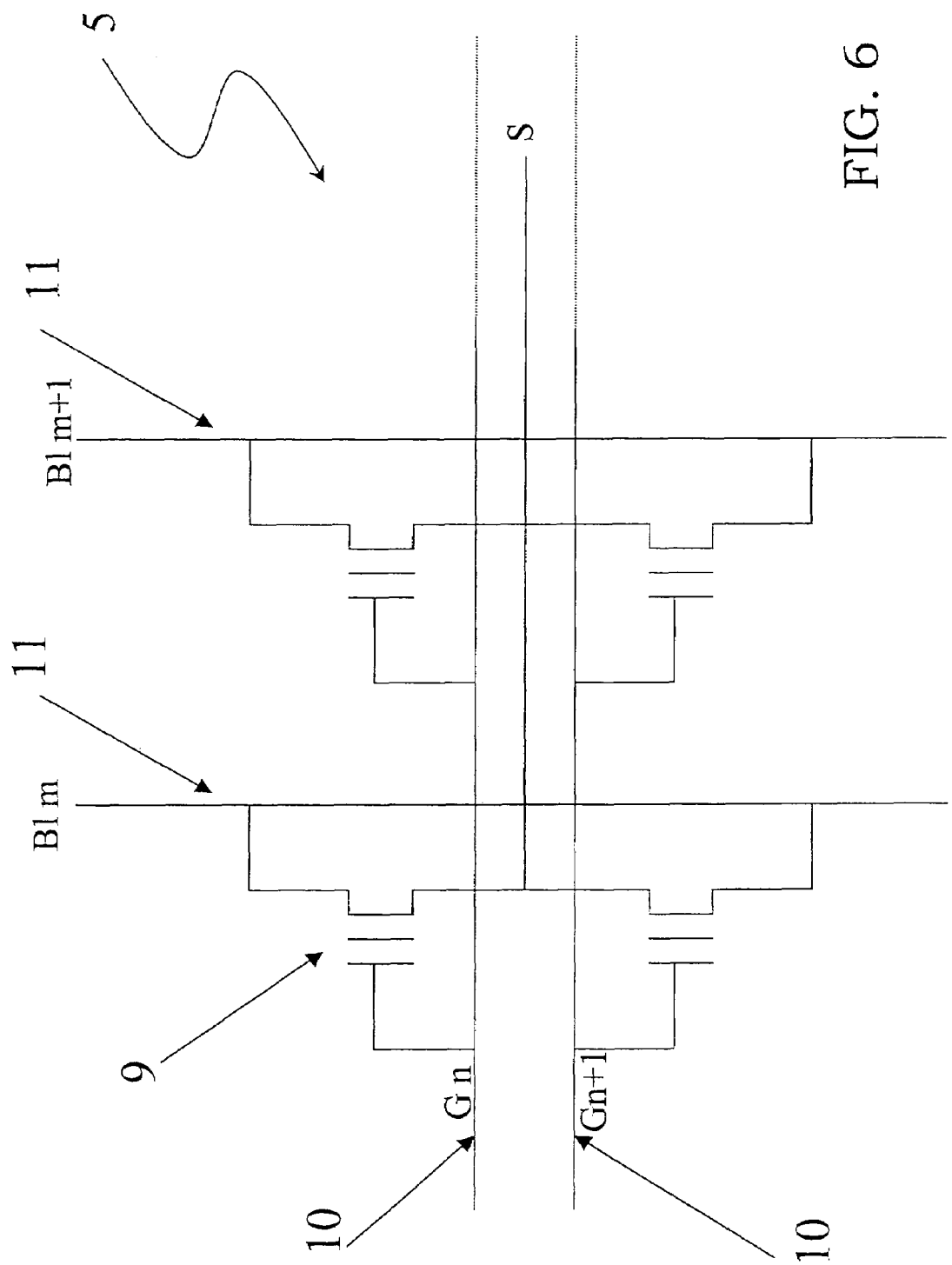
FIG. 6 schematically shows a memory cell array associated to the regulation system of FIG. 5.

Non volatile memories are electronic devices integrated on semiconductor and equipped with memory cell matrices, particularly multilevel cells. More particularly, memory device means any monolithic electronic system incorporating a matrix 5 of memory cells 9, organized in rows, referred to as word lines 10, and columns, referred to as bit lines 11, as well as circuit portions associated to the cell matrix and responsible for the functions of addressing, decoding, reading, writing and erasing the memory cell content. Such a matrix 5 is shown for example in FIG. 6. Such a device can be, for example, a memory chip integrated on semiconductor and of the non volatile EEPROM Flash type which is split in sectors and is electrically erasable.

Figure 1:
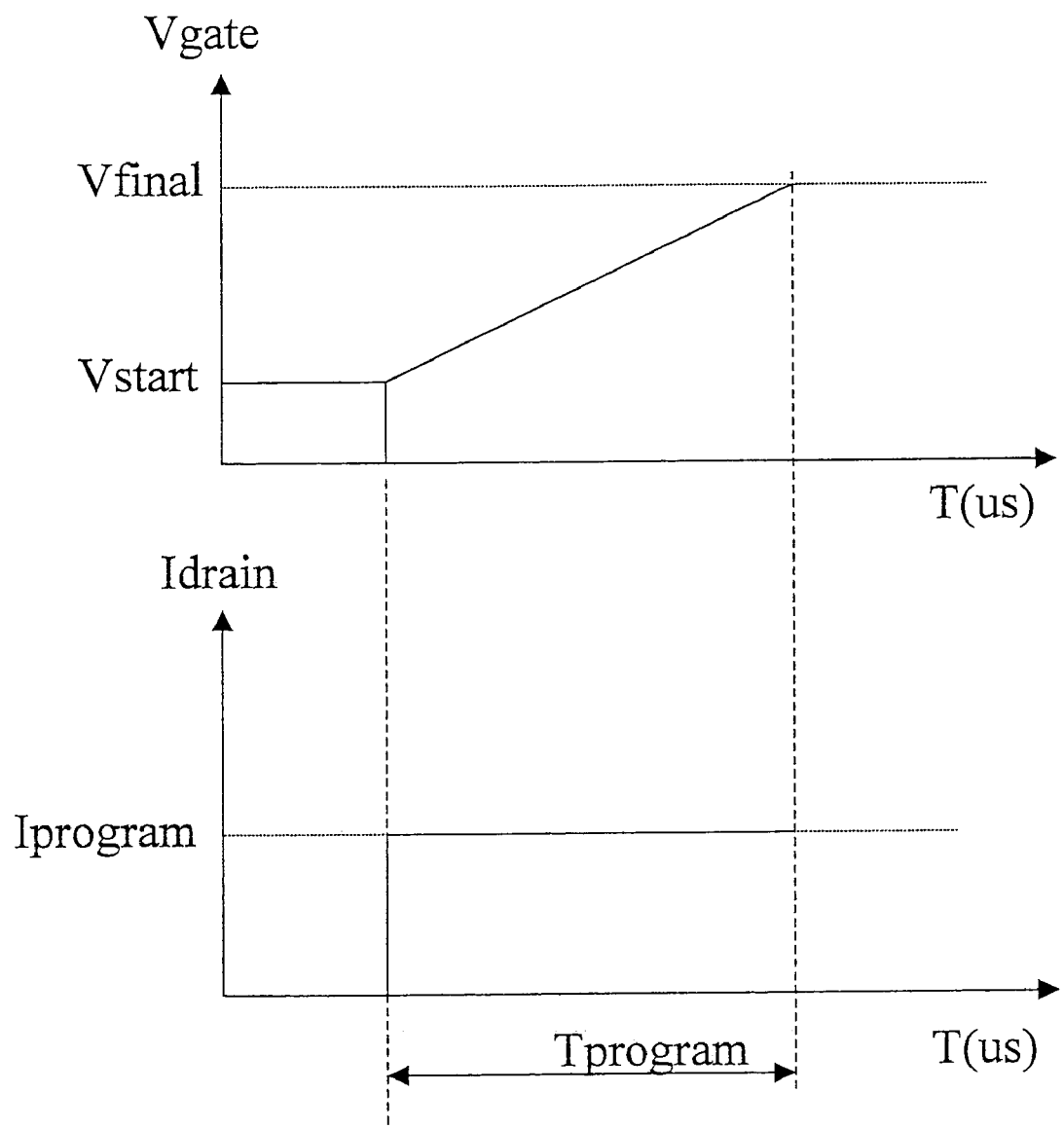
FIG. 1 schematically shows the voltage trend at the beginning and at the end of a constant current programming ramp.
Figure 2A:
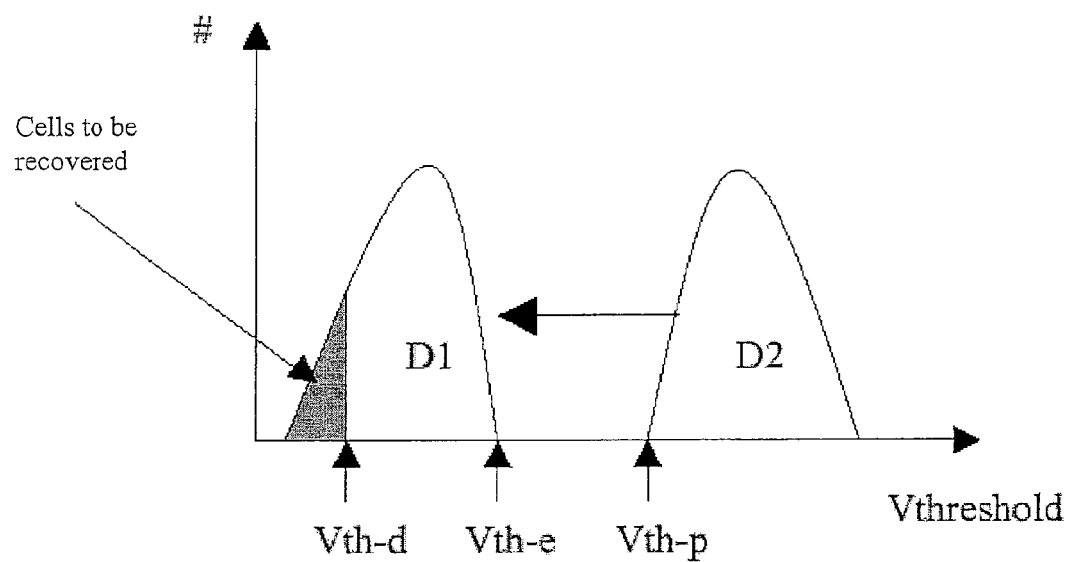
FIG. 2A schematically shows a diagram illustrating a threshold voltage distribution of memory cells in a cell array; the programmed cell distribution is indicated with D2 while the cell distribution after the erasing is indicated with D1; cells to be recovered after the erasing operation are in grey.
Figure 2B:
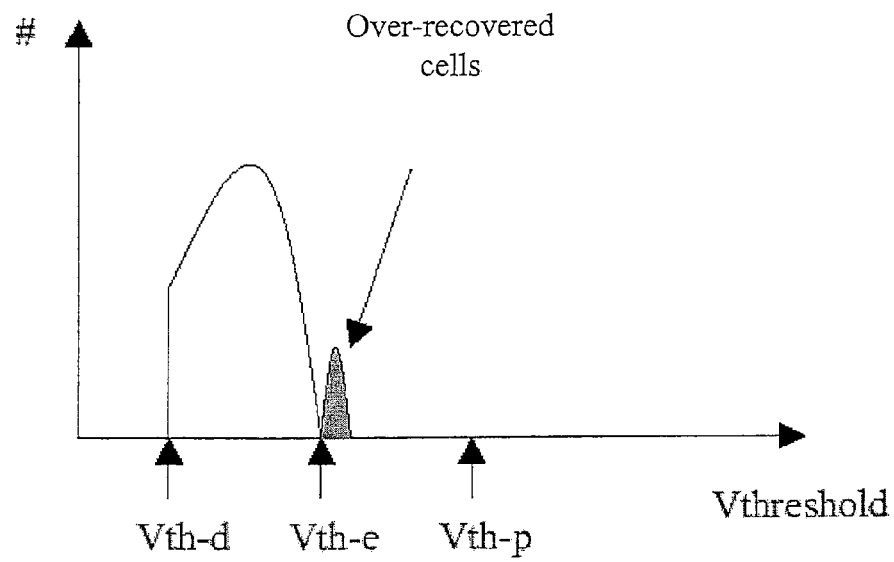
FIG. 2B schematically shows a diagram illustrating a distribution of erased memory cells in a cell array; cells being over-recovered after the erasing operation are represented in percentage in grey, in the case of a high efficiency charge pump.
Figure 3:
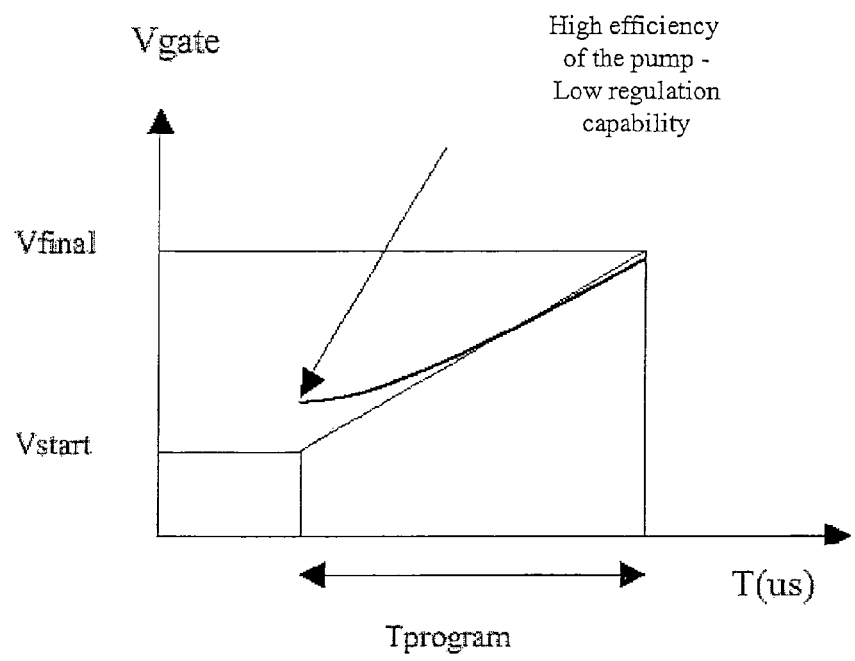
FIG. 3 schematically shows a diagram voltage vs. time comparing an ideal ramp (broken line) to a real ramp (bold print) in the case of a high efficiency charge pump.
Figure 4:
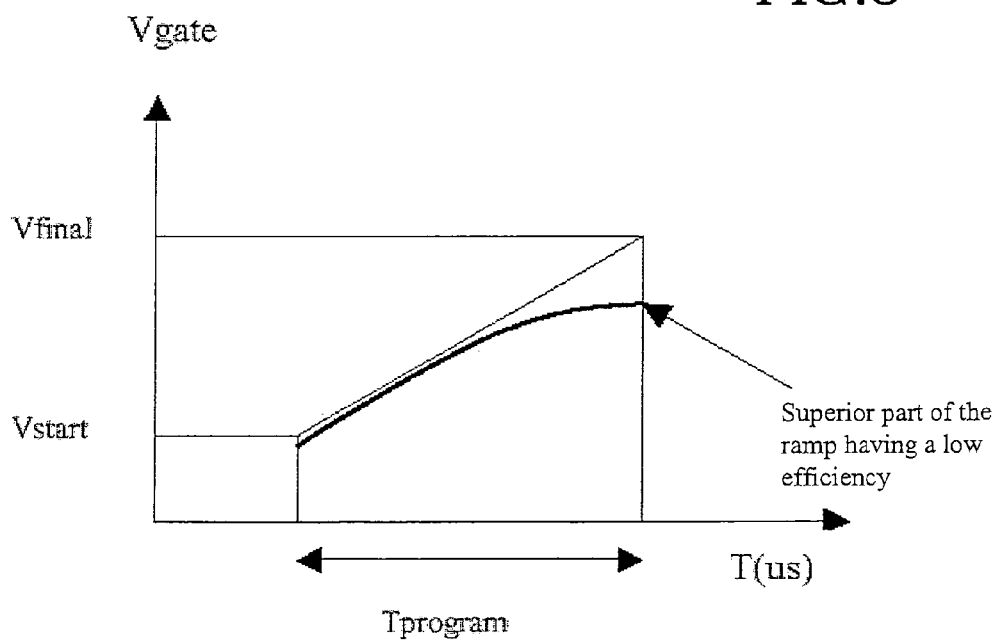
FIG. 4 schematically shows a diagram voltage vs. time comparing an ideal ramp (broken line) to a real ramp (bold print) in the case of a low efficiency charge pump.
Figure 5:
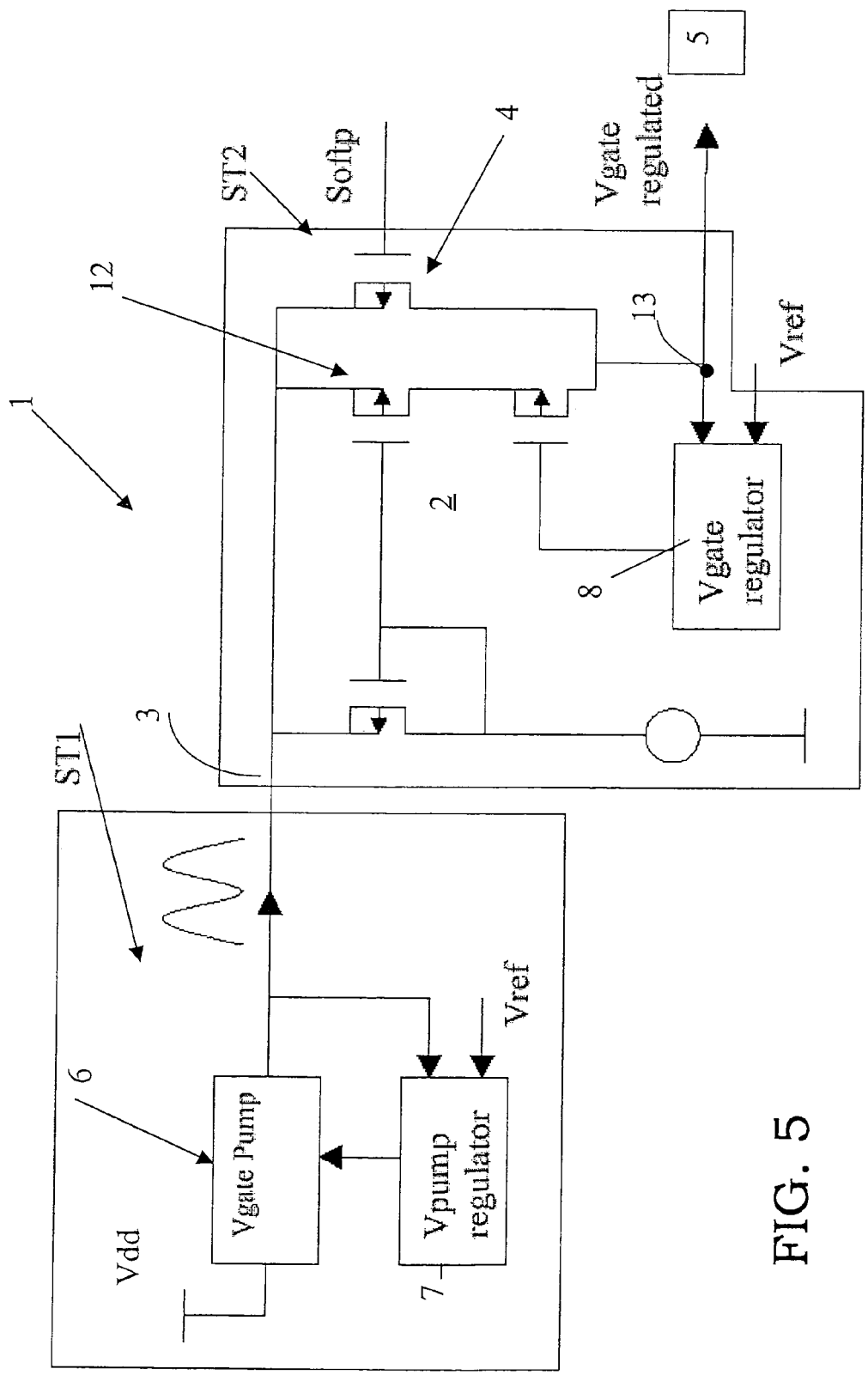
FIG. 5 schematically shows a regulation system according to the present invention for generating the gate voltage, particularly for the Programming and soft programming phase of non volatile memory cells.

Each memory cell comprises a floating gate transistor with source S, drain D and control gate G terminals. Among the circuit portions associated to the cell matrix programming circuits are provided, which are associated to the gate G terminals of the memory cells and supplied with a specific supply voltage Vdd applied to a charge pump circuit portion 6. Moreover, a voltage regulator 7 is provided for the charge pump circuit portion 6. In the example of FIG. 5 the charge pump 6 is supplied with the voltage Vdd and regulated by the output of the stable voltage regulator 7 which operates by drawing a stable voltage reference Vref.

Circuit portions 6 and 7 belong to a first regulation circuit or stage ST1 which, according to the present invention, is responsible for the creation and regulation of a voltage ramp to be applied to the gate terminals of memory cells in the programming phase. This first stage ST1 has an output 3 inputted to a second regulation circuit or stage ST2. The circuit further includes a second stage ST2 which is responsible for the creation and regulation of a voltage ramp to be applied to the gate terminals of memory cells in the soft programming phase.

Advantageously, according to the present invention, the circuitry responsible for the programming and soft programming operations has been differentiated from prior art solutions and with respect to the kind of operation being performed. In the soft programming case, instead of applying the charge pump voltage directly to the cell terminals, a regulated voltage is applied, which exploits the charge pump output as supply line.

Essentially, the system according to the invention comprises at least two main stages:

a first coarse voltage regulation stage ST1; and
a second precise regulation stage ST2.

The second stage ST2 comprises a current mirror circuit structure 2 having a transistor circuit branch coupled between the output 3 of the first stage ST1 and a ground potential reference, as well as a second transistor circuit branch coupled to the gate terminals of cells 5. In parallel to the second circuit branch an enabling transistor 4 is provided, which receives, on the control terminal thereof, a signal Softp to control the switching of the circuit operation to a soft programming phase.

A gate voltage regulator 8, receiving a voltage reference Vref, is provided to voltage-drive the gate terminal of a transistor of the second circuit branch of the current mirror structure 2. The charge pump output 6 supplies thus the current mirror structure 2 as if it were a real power supply or supply line. A transistor 12 operating in saturation conditions is provided between the voltage produced by the pump 6 output and the voltage being applied to the gate terminals of memory cells 5 through the current mirror.

The system 1 remains of the ON/OFF type in which the stage ST1 upper node is regulated by a voltage Vdd being higher than the voltages commonly used in soft programming, for example the reading voltage of 4–5V.

Since the current mirror structure 2 comprises transistors having known area and size, it is thus possible to set conveniently the charge current of node 13.

The transistor 4 inserted between the pump 6 and the node to be regulated, operating in saturation, will thus absorb all voltage changes due to pump boost changes, protecting downstream circuits which will be instead constant-current-supplied.

Very briefly, it can be said that the regulation system according to the invention exploits a current mirror supplied with a coarse regulated voltage. In other words, the operation in saturation of transistor 12 allows voltage changes between nodes 3 and 13 to be absorbed, due to the output features of a transistor operating in saturation, in practice when 3, 13 vary, the current Isource=constant and thus the node 13 charge always occurs in a controlled way.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A gate voltage regulation system for the programming and/or soft programming phase of non volatile memory cells, wherein the memory cells being organized in cell matrices with corresponding circuits responsible for addressing, decoding, reading, writing and erasing the memory cell content, comprising:
    charge pump voltage regulators for biasing gate terminals of the cells in the programming phase with a predetermined voltage value, each regulator comprising a first regulation stage and a second regulation stage, being structurally independent, which are responsible for generating output voltages for the programming phase and soft programming phase, respectively, the generated output voltage from the first stage also being a supply voltage for said second stage.

2. The system according to claim 1, wherein said second stage comprises a current mirror structure with an output stage comprising a transistor.

3. The system according to claim 2, wherein a circuit branch of said current mirror structure comprises a current mirror structure disabling transistor controlled by a switching signal in correspondence with said programming phase.

4. The system according to claim 3, wherein said structure disabling transistor of said current mirror structure operates in a saturation status.

5. The system according to claim 1, wherein said first stage comprises a charge pump supplied with a supply voltage and regulated by means of a stable voltage regulator.

6. The system according to claim 1, wherein an output of said second stage is coupled to the gate terminals of the cells.

7. A circuit, comprising:
    a first voltage regulation stage that generates a voltage ramp output at a first output;
    a second voltage regulation stage that generates a regulated voltage output at a second output; and
    a selection switch that responds to a control signal to selectively connect the first output to the second output.

8. The circuit as in claim 7 wherein the second output is coupled to gate terminals of a plurality of memory cells.

9. The circuit as in claim 8 wherein the control signal has a first value which activates the selection switch to apply the voltage ramp output to the gate terminals of the plurality of memory cells, and a second value which de-activates the selection switch to apply the regulated voltage output to the gate terminals of the plurality of memory cells.

10. The circuit as in claim 9 wherein the control signal first value causes a programming of the plurality of memory cells and the control signal second value causes a soft programming of the plurality of memory cells.

11. The circuit as in claim 7 wherein the first output of the first voltage regulation stage is a power supply for the second voltage regulation stage.

12. The circuit as in claim 7 wherein the second voltage regulation stage comprises a current mirror circuit.

13. A circuit, comprising:
    a plurality of volatile memory cells, each including a transistor, each of the transistors sharing a common gate connection; and
    a gate voltage regulator circuit having an output coupled to the common gate connection and receiving a programming control signal, the gate voltage regulator circuit comprising:
        a first regulator generating a programming ramp voltage;
        a second regulator generating a soft programming voltage; and
        a selection circuit responsive to the programming control signal for applying the programming ramp voltage to the common gate connection in a first operating mode and applying only the soft programming voltage to the common gate connection in a second operating mode.

14. The circuit of claim 13:
    wherein the first regulator has a first output at which the programming ramp voltage is generated;
    where in the second regulator has a second output at which the soft programming voltage is generated, and which is coupled to the common gate connection; and
    wherein the selection circuit comprises a switching circuit that selectively connects the first output to the second output.

15. The circuit of claim 14 wherein then switching circuit comprises a transistor having its conduction terminal coupled between the first and second outputs and its control terminal coupled to receive the programming control signal.

16. The circuit of claim 13 wherein the first regulator has a first output at which the programming ramp voltage is generated and wherein the first output of the first regulator is a power supply for the second regulator.

17. The circuit of claim 13 wherein the transistor of each volatile memory cell is a floating gate transistor.

18. The circuit of claim 13 wherein the selection circuit absorbs voltage changes in the programming ramp voltage when in the second operating mode so as to allow a substantially constant current to be supplied with the soft programming voltage.

19. The circuit of claim 18 wherein the selection circuit permits voltage changes in the programming ramp voltage to be applied to the common gate connection when in the second operating mode.

20. The circuit of claim 13 wherein the second regulator comprises a current mirror circuit operable to absorb changes in a supply voltage for the second regulator wherein that supply voltage is coupled to the first output of the first regulator.

* * * * *